United States Patent [19]
Lattin

[11] 3,978,431
[45] Aug. 31, 1976

[54] TEMPERATURE COMPENSATED OSCILLATOR

[75] Inventor: William Walter Lattin, Phoenix, Ariz.

[73] Assignee: Motorola, Inc., Chicago, Ill.

[22] Filed: July 3, 1975

[21] Appl. No.: 593,076

[52] U.S. Cl. ............................. 331/108 C; 331/57; 331/176; 331/179; 333/70 CR; 357/23
[51] Int. Cl.² ........................................... H03B 5/24
[58] Field of Search ............ 357/23, 14; 333/70 CR; 331/108, 176, 135, 136, 137, 57, 179

[56] References Cited
UNITED STATES PATENTS

| | | | |
|---|---|---|---|
| 3,388,340 | 6/1968 | Loughry | 331/57 |
| 3,416,100 | 12/1968 | Kruse, Jr. et al. | 331/137 |
| 3,708,757 | 1/1973 | Savarese et al. | 331/57 |
| 3,748,499 | 7/1973 | Schaffner | 357/14 |
| 3,757,245 | 9/1973 | Berger | 331/176 |
| 3,911,466 | 10/1975 | Lattin | 357/14 |

OTHER PUBLICATIONS
1968 Inter. Solid-State Circ. Confer., Thur. Feb. 15, 1968, "Temp.-Compen. Integ. Osc.," Pederson et al., pp. 60, 61.

*Primary Examiner*—John Kominski
*Attorney, Agent, or Firm*—Charles R. Hoffman; Harry M. Weiss

[57] ABSTRACT

An oscillator is provided the frequency of operation of which is controlled by an RC circuit the resistive element of which is an MOS load device and the capacitive element of which is an MOS enhanced capacitor. An important characteristic of this ring oscillator is that its time constant determining elements mutually compensate one another for changes in temperature. A digital enhanced capacitor can be used in this temperature compensated ring oscillator to provide greater flexibility in controlling both the frequency of operation of the oscillator and the wave shape of the output signal.

10 Claims, 5 Drawing Figures

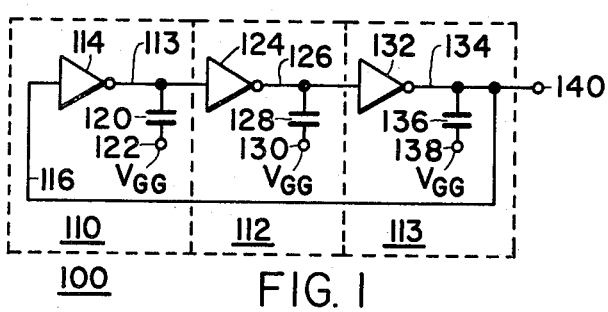
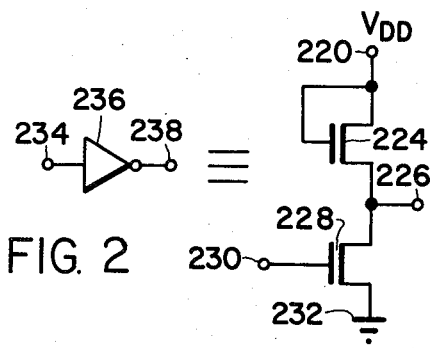
FIG. 1
FIG. 2
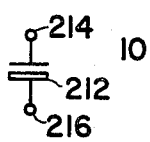
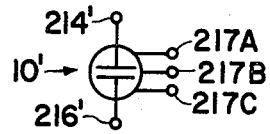
FIG. 3A   FIG. 3B
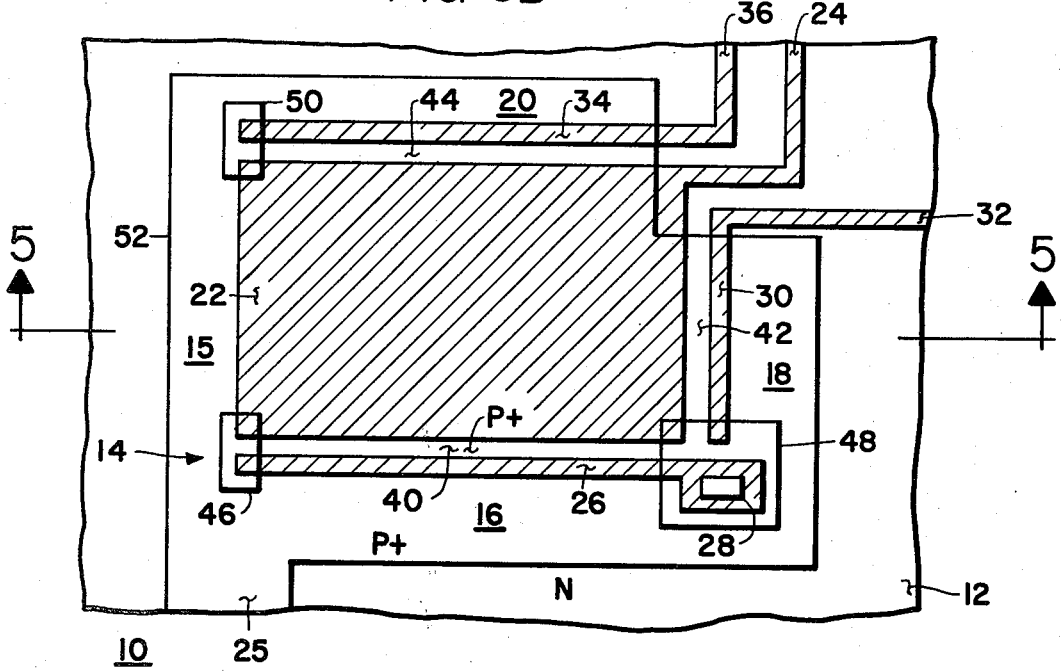
FIG. 4
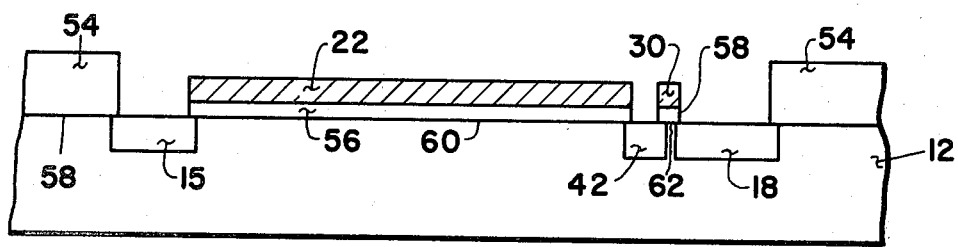
FIG. 5

TEMPERATURE COMPENSATED OSCILLATOR

BACKGROUND OF THE INVENTION

In integrated circuits the resistance of load devices is highly temperature sensitive. Variations in resistance are due primarily to changes in surface carrier mobility with temperature. Prior art integrated circuit capacitors were essentially temperature invariant. When a time constant generating circuit is constructed on an integrated circuit using a resistive load device and an ordinarily constructed integrated circuit capacitor, the RC time constant varies significantly with changes in temperature. This creates great problems in stabilizating the oscillator frequency.

SUMMARY OF THE INVENTION

It is an object of the invention to provide a temperature compensated oscillator compatible with MOS technology.

It is another object of the invention to provide a temperature compensated oscillator including a time constant generating circuit and a feedback circuit.

Briefly described, the invention provides an MOS ring oscillator circuit. The resistive element of the RC time constant generating circuit is an MOS load device and the capacitive element is an enhanced capacitor. As the operating temperature increases, the effective capacitance of the enhanced capacitor decreases and the resistance of the MOS load device increases. For any given change in temperature the changes in effective resistance and capacitance mutually compensate one another. Therefore, for any given change in temperature the frequency of operation of the ring oscillator remains constant.

BRIEF DESCRIPTION OF THE DRAWINGS

FIG. 1 is a schematic diagram of the ring oscillator according to the invention.

FIG. 2 is an illustration of one of the inverters used in the ring oscillator shown in FIG. 1, together with a detailed schematic diagram of the inverter circuitry.

FIG. 3A is a schematic diagram of an enhanced capacitor.

FIG. 3B is a schematic diagram of a digitally controlled enhanced capacitor.

FIG. 4 is a plan view of a digitally controllable enhanced field effect capacitor.

FIG. 5 is a cross-sectional view of the embodiment of FIG. 4 taken along the lines 2—2.

DESCRIPTION OF THE INVENTION

FIG. 1 shows a schematic diagram of an embodiment of a ring oscillator using an enhanced capacitor. Ring oscillator 100 includes first stage 110, second stage 112 and third stage 113. First stage 110 includes inverter 114 which has its input connected to feedback conductor 116 and its output connected to conductor 118. Enhanced capacitor 120 is connected between voltage source node 122 and conductor 118. Second stage 112 includes inverter 124 which has its input connected to conductor 118 and its output connected to conductor 126. Enhanced capacitor 128 is connected between voltage source node 130 and conductor 126. Third stage 113 includes inverter 132 which has its input connected to conductor 126 and its output connected to conductor 134. Enhanced capacitor 136 is connected between conductor 134 and voltage source node 138. The output of ring oscillator 100 is derived from node 140.

The left hand side of FIG. 2 shows inverter 236 typical of the inverters used in ring oscillator 100 with input node 234 and output node 238. The right hand side of FIG. 2 shows a more detailed schematic diagram of inverter 236 where the input is derived from node 230 and the output is derived from node 226. Supply voltage VDD is connected to node 220. Node 232 provides the ground for the device. Load device 224 is connected between node 220 and node 226. Switching device 228 is connected between node 226 and ground node 232. FIG. 3A shows a schematic diagram of the enhanced capacitor used in ring oscillator 100 shown in FIG. 1 Node 214 of enhanced capacitor 10 couples enhanced capacitor 10 to the circuitry of ring oscillator 100. Node 216 of enhanced capacitor 10 is normally connected to a voltage source. Electrode 212 of enhanced capacitor 10 is constructed of polycrystalline silicon.

FIG. 3B depicts digital enhanced capacitor 10', described hereinafter, the capacitance of which can be digitally varied by applying a control voltage to one or several of a plurality of control conductors. In FIG. 3B the control conductors are represented by nodes 217A, 217B and 217C.

Digital enhanced capacitor 10' in FIG. 3B can be substituted for one or more of the three enhanced capacitors shown in ring oscillator 100. If three digital enhanced capacitors are used in ring oscillator 100 and the value of all are the same, a switching circuit can be devised such that all three digital enhanced capacitors can be varied independently of one another. This provides a capability for not only changing the frequency of operation of ring oscillator 100 but also for tailoring the wave shape of the output waveform.

By making the largest of the enhanced capacitors in ring oscillator 100 a digital enhanced capacitor, the frequency of operation of ring oscillator 100 can be controlled by digitally varying the capacitance of the digital enhanced capacitor. Where the resistance of the load device in each stage of ring oscillator 100 is the same, the largest capacitor acts as the dominate frequency determining component. The other two stages with the smaller enhanced capacitors have comparatively short RC time constants and are not able to function in a manner that can significantly affect the frequency of operation of the device.

An embodiment of the enhanced capacitor is shown in FIG. 4, which is a plan view of digitally controllable enhanced field effect capacitor 10 described in patent application Ser. No. 410,678. Capacitor 10 is fabricated within a relatively lightly doped N-type region 12, which may have resistivity in the range from approximately 2 – 10 ohm-centimeters. Referring to both FIG. 4 and FIG. 5, capacitor 10 includes a relatively low resistivity (10 – 100 ohms per square) P-type region 14 formed within the N-type region 12 at upper surface 58 thereof. P-type region 14 forms the source region for enhanced capacitor 10, and includes main subregion 15 and secondary subregions 16, 18 and 20.

Main gate conductor 22 overlies gate insulator 56, which may be silicon dioxide, which in turn lies on main channel region 60 in the portion of N-type body of semiconductor 12 at surface 58 underlying and coextensive with gate insulator 56. Gate insulator 56 may be approximately 1000 angstrom units in thickness. Gate conductor 22 is advantageously doped polycrystalline silicon having resistivity in the range from 25 to 300 ohms per square, and includes a polycrystalline silicon extension over thick field insulator 54 (which may be silicon dioxide 4,000 – 10,000 or more angstrom units thick) forming main gate electrode 24. Polycrystalline silicon region 30 lies on secondary gate oxide layer 58, forming a secondary channel region 62 which extends between source subregion 18 and drain region 42. Polycrystalline region 30 extends over thick oxide 54 to form secondary gate electrode 32. Similarly, polycrystalline region 26 overlies another secondary channel region thereunder which couples source subregion 16 to drain subregion 40, and polycrystalline region 34 overlies another channel subregion self-aligned therewith coupling source subregion 20 to drain subregion 44. Polycrystalline silicon gate conductors 26 and 34 extend, respectively, over field oxide 54 forming secondary gate electrodes 28 and 36.

Thick oxide regions 46, 48 and 50 prevent parasitic channeling around, and also define, the end points of drain subregions 40, 42 and 44. The boundary 52 defines the edge of thick oxide region 54 which bounds P-type region 14.

As is well-known, the main channel region 60 and the aforementioned secondary channel regions are self-aligned to the adjacent P-type regions because they are formed during the same processing step at which the polycrystalline silicon gate conductors are doped. The polycrystalline silicon gate conductors and also the thick oxide 54 serve as diffusion masks, thereby providing a self-aligned structure.

The mode of operation of ring oscillator 100 is well known and will not be described in detail. The frequency of operation is determined by the RC time constants of ring oscillator 100. The impedance of a load device such as 224 determined the resistive element of each RC time constant while the capacitance of an enhanced capacitor, such as 120, 128 or 136, determines the capacitive element of each RC time constant. The values of resistance and capacitance in stages 110, 112 and 113 could be identical, but this is not necessarily a requirement for operation of the circuit.

A unique characteristic of ring oscillator 100 is that its time constant determining elements mutually compensate each other for changes in temperature. This temperature compensation characteristic results from the fact that the resistance of load device 224 in each stage is inversely proportional to the surface carrier mobility of the semiconductor material while the capacitance of the enhanced capacitor in each stage is directly proportional to the surface carrier mobility.

The fact that the capacitance of an enhanced capacitor is directly proportional to temperature can readily be explained in terms of surface carrier mobility. As temperature increases the surface carrier mobility in the enhanced capacitor channel region decreases. This results in an increase in the channel resistance. As the distance along the channel from the source region increases, the increase in channel resistance acts to decrease the flow of current across the channel region. The current flow at the source connection has the greatest magnitude while the current at the opposite end of the channel has the least magnitude. This results in the presence of a decreasing current gradient across the channel region. Since capacitance is a function of charge and therefore also a function of current flow, this current gradient across the channel of the enhanced capacitor causes a corresponding decrease in the total effective capacitance due to the decreased capacitive contribution of the more remote areas of the enhanced capacitor. Therefore, the capacitance of the enhanced capacitor is directly proportional to the surface carrier mobility. Since surface carrier mobility is inversely porportional to temperature, the effective capacitance of the enhanced capacitor will be inversely proportional to temperature.

Since the temperature variation of the resistive element of the time constant generating circuit is inversely proportional to surface carrier mobility and the temperature variation of the capacitive element of the time constant generating circuit is directly proportional to the surface carrier mobility, these variations which are caused by changes in surface carrier mobility cancel each other when the resistive and capacitive elements are connected together in an RC time constant generating circuit. Another way of stating this is to say that the resistive element has a positive temperature coefficient; that the capacitive element has a negative temperature coefficient; and that the magnitudes of the temperature coefficients are equal.

As the operating frequency of the oscillator is decreased the temperature compensation effect is reduced. This is especially true for enhanced capacitors of small geometry.

What is claimed is:

1. A temperature compensated oscillator including a time constant generating circuit and a feedback circuit comprising:
   impedance means coupled between a voltage conductor and a first node for supplying a current into said node, which current decreases as temperature increases; and
   enhanced capacitor means forming the second element of the time constant coupled between said first node and a second voltage conductor for being charged through said impedance means, said enhanced capacitor having a capacitance which decreases as temperature increases, such that the RC time constant remains substantially fixed in value with variations in temperature.

2. A temperature compensated oscillator as recited in claim 1 wherein said enhanced capacitor means includes a digital enhanced capacitor.

3. The oscillator as recited in claim 2 further including a plurality of digital inputs coupled to said digital enhanced capacitor for controlling the frequency of said oscillator.

4. A temperature compensated oscillator including a time constant generating circuit comprising:
   first resistor means coupled between a first voltage supply conductor and a first node for supplying a negative temperature coefficient current into said first node;
   second resistor means coupled between a second voltage supply conductor and said first node for sinking a negative temperature coefficient current from said first node;
   an MOS enhanced capacitor means coupled between said first node and voltage supply means for compensating said negative temperature coefficient currents by increasing its value of capacitance as a function of temperature.

5. A digitally controllable oscillator including a time constant generating circuit comprising impedance means and digital enhanced capacitor means coupled to said impedance means and at least one enhanced capacitor control input for digitally controlling the time constant of a signal generated by said time constant generating circuit as a function of a control signal applied to said control input.

6. The oscillator cited in claim 5 wherein said impedance means includes at least one MOS field effect transistor coupled to a source region of said digital enhanced capacitor means for producing a temperature compensated time constant for said signal generated by said time constant generating circuit.

7. An MOS temperature compensated oscillator comprising:
   a first MOS inverter having an input coupled to an output of a third MOS inverter;
   a second MOS inverter having an input coupled to an output of said first MOS inverter;
   said third MOS inverter having an input coupled to an output of said second MOS inverter; and
   first, second and third enhanced capacitors coupled between a voltage conductor means and the outputs of said first, second and third stages respectively.

8. The MOS oscillator as recited in claim 7 further including a plurality of digital inputs coupled to said first, second, and third capacitors, respectively, for controlling the frequency and wave shape of said oscillator.

9. A method of operating an oscillator with impedance means coupled to a node and enhanced capacitor means coupled to said node comprising the steps of:
   causing a first current to flow through said impedance means into and out of said node, said impedance means having a positive temperature coefficient;
   causing a second current to flow through said enhanced capacitor means into and out of said node, said enhanced capacitor means having a negative temperature coefficient; and
   said impedance means and said enhanced capacitor means acting to form a time constant for said oscillator.

10. A temperature compensated MOS oscillator, comprising a first active region for providing resistive impedance, wherein the resistance of said impedance is inversely proportional to charge mobility of the region, the second active region for providing capacitive impedance and operatively coupled to said first active region, wherein said second active region is configured to provide a capacitance which is directly proportional to said charge mobility so that the temperature variant nature of the mobility in said first region is compensated by that of said second region whereby said MOS oscillator is rendered substantially temperature invariant.

\* \* \* \* \*